(12) United States Patent
Marks et al.

(10) Patent No.: US 7,888,593 B2
(45) Date of Patent: *Feb. 15, 2011

(54) TFB:TPDSI2 INTERFACIAL LAYER USABLE IN ORGANIC PHOTOVOLTAIC CELLS

(75) Inventors: Iobin J. Marks, Evanston, IL (US); Alexander W. Hains, Evanston, IL (US)

(73) Assignee: Northwestern University, Evanston, IL (US)

(*) Notice: Subject to any disclaimer, the term of this patent is extended or adjusted under 35 U.S.C. 154(b) by 113 days.

This patent is subject to a terminal disclaimer.

(21) Appl. No.: 12/046,983

(22) Filed: Mar. 12, 2008

(65) Prior Publication Data

US 2009/0056810 A1    Mar. 5, 2009

Related U.S. Application Data

(60) Provisional application No. 60/967,480, filed on Sep. 5, 2007.

(51) Int. Cl.
*H01L 31/00* (2006.01)
(52) U.S. Cl. .................................... 136/263
(58) Field of Classification Search ........... 136/263
See application file for complete search history.

(56) References Cited

U.S. PATENT DOCUMENTS

| | | | |
|---|---|---|---|
| 6,189,091 B1* | 2/2001 | Col et al. ...................... | 712/240 |
| 2005/0061363 A1* | 3/2005 | Ginley et al. ................ | 136/252 |
| 2005/0147846 A1 | 7/2005 | Marks et al. | |
| 2006/0013549 A1 | 1/2006 | Shtein et al. | |
| 2006/0207652 A1* | 9/2006 | Brabec et al. ............... | 136/263 |
| 2007/0089779 A1* | 4/2007 | Balasubramanian et al. | 136/252 |

OTHER PUBLICATIONS

Martens, T., et al. "Disclosure of the nanostructure of MDMO-PPV:PCBM bulk hetero-junction organic solar cells by a combination of SPM and TEM," Synthetic Metals 138 (2003) 243-247.*
Sun, Sam-Shajing, et al. "Organic photovoltaics: mechanism, materials, and devices," Taylor and Francis Group, Boca Raton, FL, 2005, p. 546.*
Bettignies et al. "Accelerated lifetime measurements of P3HT:PCBM solar cells" Synthetic Metals 156 (2006) 510-513.*
Al-Ibrahim et al. "Comparison of normal and inverse poly(3-hexylthiophene)/fullerene solar cell architectures" Solar Energy Materials & Solar Cells 85 (2005) 277-283.*
Chen et al. "Hybrid organic on inorganic semiconductor heterojunction" J Mater Sci: Mater Electron (2006) 17:1047-1053.*

* cited by examiner

*Primary Examiner*—Jeffrey T Barton
*Assistant Examiner*—Allison Bourke
(74) *Attorney, Agent, or Firm*—Tim Tingkang Xia; Morris, Manning & Martin, LLP (57) ABSTRACT

The present invention, in one aspect, relates to a solar cell. In one embodiment, the solar cell includes an anode; an active organic layer comprising an electron-donating organic material and an electron-accepting organic material; and an interfacial layer formed between the anode and active organic layer, where the interfacial layer comprises a hole-transporting polymer characterized with a hole-mobility higher than that of the electron-donating organic material in the active organic layer, and a small molecule that has a high hole-mobility and is capable of crosslinking on contact with air.

17 Claims, 6 Drawing Sheets

TFB:TPDSI2 INTERFACIAL LAYER USABLE IN ORGANIC PHOTOVOLTAIC CELLS

CROSS-REFERENCE TO RELATED PATENT APPLICATION

This application claims the benefit, pursuant to 35 U.S.C. §119(e), of U.S. provisional patent application Ser. No. 60/967,480, filed Sep. 5, 2007, entitled "TFB:TPDSi$_2$ INTERFACIAL LAYER USABLE IN ORGANIC PHOTOVOLTAIC CELLS," by Tobin J. Marks and Alexander W. Hains, which is incorporated herein by reference in its entirety.

Some references, which may include patents, patent applications and various publications, are cited in a reference list and discussed in the description of this invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference was individually incorporated by reference. In terms of notation, hereinafter, "[n]" represents the nth reference cited in the reference list. For example, [16] represents the 16th reference cited in the reference list, namely, A. W. Hains, A. B. F. Martinson, M. D. Irwin, H. Yan and T. J. Marks, Polym. Mater. Sci. Eng. 96, 814 (2007).

STATEMENT AS TO RIGHTS UNDER FEDERALLY-SPONSORED RESEARCH

The invention was made with government support under Contract No. DE-FG02-06ER46320 awarded by the Department of Energy of the United States. The government has certain rights to the invention.

FIELD OF THE INVENTION

The present invention relates generally to a photovoltaic device, and more particularly to a bulk-heterojunction solar cell that utilizes an interfacial layer of TPDSi$_2$:TFB to enhance the solar cell performance, which can be used in a photovoltaic device.

BACKGROUND OF THE INVENTION

Organic photovoltaic (OPV) cells offer potential advantages over traditional inorganic solar cells which include the use of low-cost light-weight materials, compatibility with plastic substrates to yield flexible solar cells, and amenability to inexpensive, low-temperature, reel-to-reel solution-processing techniques. These potential advantages have spurred researchers in recent years to make significant advances in the efficiencies of OPVs up to a current highest power efficiency near 6% for bulk-heterojunction cells [1-6]. Although this is still significantly below the efficiency of single crystal-Si cells, it approaches that of amorphous silicon (a-Si) cells with power efficiencies about 7-10%. At this point it is thought that OPVs will likely become commercially viable [7].

Recent advances in OPVs have utilized new materials for collecting light and transporting charges to the electrodes [8, 9], while others have come from redesigning the cell architecture to more efficiently separate excitons and collect the resultant charges [10-12]. In a bulk-heterojunction (BHJ) solar cell, a donor polymer and an acceptor material are combined in solution and together spin-coated to form a phase-separated blend on the transparent conductive anode, usually tin-doped indium oxide (ITO). Fabrication is completed by depositing a metal such as aluminum as the cell cathode. The BHJ cell design is a major improvement over bilayer cell designs because it allows photogenerated excitons to reach the donor/acceptor interface to form holes and electrons before recombination. Despite the large improvement in efficiency achieved by the BHJ design, one major disadvantage of the BHJ architecture is the inherent disorder in the heterojunction. After the photogenerated excitons separate, charges travel a circuitous route within their respective material (holes in the donor network, electrons in the acceptor network), often in close proximity to the opposite charges, until collection at the electrodes or recombination occurs.

In addition to charge recombination within the active layer reducing efficiency in BHJ cells, charge recombination at the active organic layer/electrode interfaces is also a problem that can erode device efficiency [13]. One reason for this is a poor surface energy match between the organic active layer and the inorganic electrodes. If an acceptable ohmic contact is not made, charges do not pass freely to the electrode, and device performance suffers. Even if contact is good initially, under heat and light, the organic active layer may lose cohesion with the ITO over time, compromising device durability.

Another loss at the electrode/active layer interface arises from the BHJ design having both the donor and acceptor in contact with both electrodes, allowing charges to flow in the wrong direction. That is, it becomes energetically favorable for electrons formed near in proximity to the anode, for example, to travel from the lowest unoccupied molecular orbital (LUMO) of the acceptor network to the ITO anode. Even though the built-in electric field of the device would direct these charges the other way, there is not always a direct pathway for these charges to travel along the electric field in the disordered BHJ [1, 14], and the energetically favorable transfer of electrons from the [6,6]-phenyl-C$_{61}$-butyric acid methyl ester (PCBM) to the ITO anode at their interface represents loss via charge recombination [15]. The small bias from these charges "leaking" to the wrong electrode reduces the observed open-circuit voltage ($V_{oc}$) and power conversion efficiency ($\eta_p$) of the device [16].

One way to compensate poor active layer/electrode contact and charge leakage is to insert an interfacial layer that improves contact and only allows charge carriers of the proper type to pass through to the electrode. The performance of BHJ cells having the three-layer structure ITO/donor:acceptor/Al is improved substantially by inserting interfacial layers between the active organic and the electrodes [15]. A thin layer of lithium fluoride (LiF) is deposited on the cathode side, and a thin semiconducting poly(3,4-ethylenedioxythiophene):poly(styrenesulfonate) (PEDOT:PSS) is frequently used on the anode side.

Figure 6:
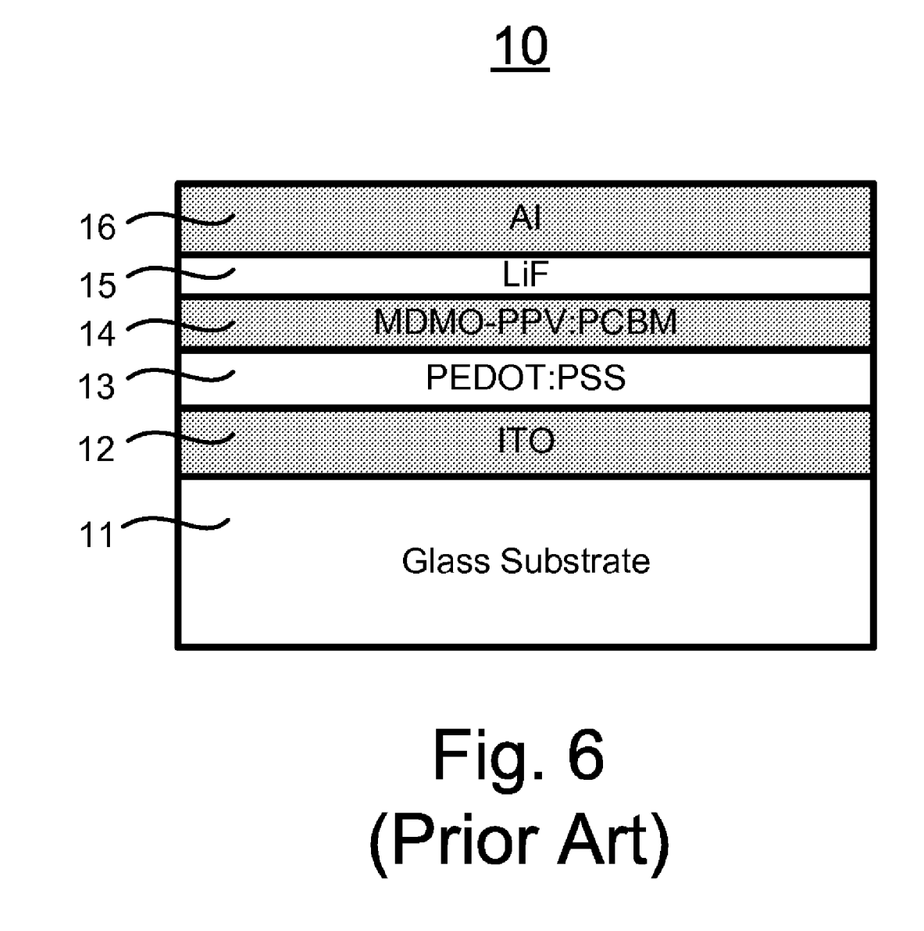
FIG. 6 shows schematically a conventional PEDOT:PSS BHJ solar cell device.

FIG. 6 shows schematically a conventional BHJ solar cell 10 including an ITO anode 12 formed on a glass substrate 11, a PEDOT:PSS layer 13 formed on the ITO anode 12, an active layer 14 of poly(2-methoxy-5-(3',7'-dimethyloctyloxy)-1,4-phenylenevinylene) (MDMO-PPV) and PCBM formed on the PEDOT:PSS layer 13, a LiF layer 15 formed on the active layer 14, and an aluminum (Al) cathodal layer 16 formed on the LiF layer 15. For such a BHJ solar cell, the open-circuit voltage $V_{oc}$=0.82 V, short-circuit current $J_{SC}$=5.25 mA/cm$^2$, fill factor (FF)=61%, and $\eta_p$=2.5% [17]. The role of a very thin layer (about 0.6 nm) of LiF has been explored previously, and it is thought to either protect the organic materials during cathode deposition, modify the work function of the electrode, or form a dipole moment across the junction and leads to increased charge transfer to the electrode [18-20]. The same active layer incorporated into a cell without a LiF layer yields a consistently lower $V_{oc}$, FF and $\eta_p$ [18]. Similarly on the anode side, the PEDOT:PSS interfacial layer significantly increases $V_{OC}$ [21, 22] of the cell. The PEDOT:PSS is also reported to enhance device consistency, with fewer cells shorting out when the PEDOT:PSS is used [21].

Despite these advantages of a PEDOT:PSS interfacial layer formed on an ITO anode compared to a bare ITO anode, the PEDOT:PSS is a very corrosive aqueous blend of materials having pH<1 [23-25], and films of PEDOT:PSS on an ITO anode have been shown to corrode the underlying surface. XPS shows that the PEDOT:PSS actually partially dissolves the surface ITO anode with In and Sn diffusing through the organic film [25]. Also, since no strong covalent bonds holding the PEDOT:PSS to the surface, the PEDOT:PSS can undergo dewetting from either the underlying ITO surface or the overlying active layer surface on exposure to heat, leading to catastrophic decreases in device performance [26].

Therefore, a heretofore unaddressed need exists in the art to address the aforementioned deficiencies and inadequacies.

SUMMARY OF THE INVENTION

In one aspect, the present invention relates to a solar cell. In one embodiment, the solar cell has a transparent substrate; an ITO anode formed on the transparent substrate; an interfacial layer formed on the ITO anode; an active organic layer formed on the interfacial layer; a LiF layer formed on the active organic layer; and an Al cathode formed on the LiF layer. The interfacial layer comprises poly(9,9-dioctylfluorene-co-N-(4-(3-methylpropyl))diphenylamine) (TFB) and 4,4'-bis[(p-trichlorosilylpropylphenyl)phenylamino]biphenyl (TPDSi$_2$) and has a thickness of about 1-80 nm, preferably, about 2-30 nm. In one embodiment, the ratio of TPDSi$_2$ to TFB in the interfacial layer is about 1:1 in weight. The active organic layer includes MDMO-PPV and PCBM. In one embodiment, the ratio of MDMO-PPV to PCBM in the active organic layer is about 1:4 in weight.

In another aspect, the present invention relates to an organic photovoltaic device that includes one or more solar cells as disclosed above.

In yet another aspect, the present invention relates to a solar cell. In one embodiment, the solar cell includes a transparent anode of ITO; an active organic layer comprising an electron-donating organic material and an electron-accepting organic material; and an interfacial layer formed between the anode and active organic layer. The solar cell further includes a LiF layer formed on the active organic layer; and a cathode formed on the LiF layer. In one embodiment, the cathode is formed of a metal, where the metal comprises Al, titanium (Ti), tungsten (W), silver (Ag), gold (Au), an alloy thereof, or the like.

The interfacial layer comprises a hole-transporting polymer characterized with a hole-mobility higher than that of the electron-donating organic material in the active organic layer, and a small molecule characterized with a hole-mobility higher than that of the electron-donating organic material in the active organic layer and capable of crosslinking on contact with air. In one embodiment, the hole-transporting polymer comprises TFB, and the small molecule includes TPDSi$_2$. The ratio of TPDSi$_2$ to TFB in the interfacial layer is about 1:1 in weight. The interfacial layer in one embodiment has a thickness of about 1-80 nm, preferably, about 2-30 nm.

The interfacial layer is transparent to light of wavelengths greater than 430 nm so that it has no interference with light reaching the active organic layer.

In one embodiment, the interfacial layer is adapted such that the highest occupied molecular orbital (HOMO) levels of the hole-transporting polymer and the small molecule are aligned with the HOMO level of the electron-donating organic material in the active organic layer so that holes generated in the active organic layer are able to travel through the interfacial layer for collection at the anode without an energetic barrier. Furthermore, the interfacial layer is adapted such that the LUMO levels of the hole-transporting polymer and the small molecule lie far above the LUMO level of the electron-accepting organic material in the active organic layer so that an energetic barrier is present to prevent electrons generated in the active organic layer from transferring through the interfacial layer into the anode.

Alternatively, the interfacial layer is adapted for blocking electron leakage from the active organic layer to the anode while transporting holes from the active organic layer to the anode.

In one embodiment, the electron-donating organic material comprises poly(3-hexylthiophene) (P3HT), MDMO-PPV, poly(2,7-(9-(2'-ethylhexyl)-9-hexyl-fluorene)-alt-5,5-(4',7'-di-2-thienyl-2',1',3'-benzothiadiazole)) (PFDTBT), poly(2,6-(4,4-bis-(2-ethylhexyl)-4H-cyclopenta(2,1-b; 3, 4-6') dithiophene)-alt-4,7-(2,1,3-benzothiadiazole)) (PCPDTBT), or poly(p-phenylene-ethynylene)-alt-poly(p-phenylene-vinylene) (PPE-PPV), and the electron-accepting organic material comprises PCBM, or another C60/C70 based derivative. In one embodiment, the ratio of the electron-donating organic material to the electron-accepting organic material in the active organic layer is about 1:4 in weight.

In a further aspect, the present invention relates to an organic photovoltaic device comprising a plurality of solar cells as described above. The plurality of solar cells are configured to be in a stack.

These and other aspects of the present invention will become apparent from the following description of the preferred embodiment taken in conjunction with the following drawings, although variations and modifications therein may be affected without departing from the spirit and scope of the novel concepts of the disclosure.

DETAILED DESCRIPTION OF THE INVENTION

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention. Additionally, some terms used in this specification are more specifically defined below.

DEFINITIONS

The terms used in this specification generally have their ordinary meanings in the art, within the context of the invention, and in the specific context where each term is used. Certain terms that are used to describe the invention are discussed below, or elsewhere in the specification, to provide additional guidance to the practitioner regarding the description of the invention. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the invention or of any exemplified term. Likewise, the invention is not limited to various embodiments given in this specification.

Unless otherwise defined, all technical and scientific terms used herein have the same meaning as commonly understood by one of ordinary skill in the art to which this invention pertains. In the case of conflict, the present document, including definitions will control.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the term "open-circuit voltage" refers to the difference of electrical potential between two terminals of a device when there is no external load connected, i.e., the circuit is broken or open. Under these conditions there is no external electric current flow between the terminals, although there may be current flow internally (e.g., self-discharge currents in batteries). As known to those skilled in the art, the open-circuit voltage of solar cells is often quoted under particular conditions (state-of-charge, illumination, temperature, etc.). Usually, the energetic difference between the HOMO of the donor material and the LUMO of the acceptor material in a solar cell less the exciton binding energy defines the theoretical maximum open-circuit voltage, $V_{oc}$.

The term "fill factor" or its acronym "FF", as used herein, refers to the ratio of the maximum power ($V_{mp} \times J_{mp}$) divided by the short-circuit current density ($J_{sc}$) and open-circuit voltage ($V_{oc}$) in light current density-voltage (J-V) characteristics of solar cells. The open circuit voltage ($V_{oc}$) is the maximum voltage obtainable at the load under open-circuit conditions. The short circuit current density ($J_{sc}$) is the maximum current through the load under short-circuit conditions.

The term "power conversion efficiency ($\eta_p$)" of a solar cell, as used herein, is defined as follows:

$$\eta_p = \frac{P_{out}}{P_{in}} = \frac{V_{oc} J_{sc} FF}{P_{in}}$$

where $P_{out}$ is the power output of the solar cell, $P_{in}$ is the power of incident light source (mW/cm$^2$), and $J_{sc}$ is the short-circuit current density (mA/cm$^2$) of the solar cell.

OVERVIEW OF THE INVENTION

Realistic PEDOT:PSS replacements are subject to several fundamental constraints: 1) Sufficient optical transparency to allow solar photons access to the active layer, requiring wide band-gap semiconductors ($E_{gap} > 3$ eV) transparent in the visible spectral region. 2) Effective blocking of electron leakage to the anode while efficiently transporting holes to the anode. This capability would address the aforementioned shortcoming of BHJ cells having both donor and acceptor active layer materials in direct contact with both electrodes. All other things being equal, a blend of a hole-transporting polymer TFB and a small molecule TPDSi$_2$ should be far more resistive to electron than to hole transport provided that the conduction band minimum (CBM) is sufficiently above the LUMO of the organic donor material. 3) Appropriate energy level alignment to allow ohmic contact to the donor material. And 4) Ambient chemical stability and inertness with respect to the adjacent device layers.

The present invention provides, among other things, a BHJ solar cell that utilizes a thin, covalently-bound interfacial layer of TPDSi$_2$:TFB to maximize hole transport from the active layer to the anode and to minimize charge recombination losses at the anode. The TPDSi$_2$:TFB blend is compatible with BHJ solar cell designs, transports holes while blocking misdirected electrons, and crosslinks in air to form a robust matrix which covalently bonds to the ITO anode. These properties afford excellent cell thermal durability versus solar cells with a PEDOT:PSS interfacial layer, or with no interfacial layer. Moreover, the performance metrics of the TPDSi$_2$:TFB-modified solar cells are significantly higher than solar cells fabricated with a PEDOT:PSS interfacial layer, or with no interfacial layer. In one embodiment, for an MDMO-PPV: PCBM BHJ solar cell with a TPDSi$_2$:TFB interfacial layer, $V_{oc} = 0.89$ V, $J_{sc} = 4.62$ mA/cm$^2$, FF=54.4%, and $\eta_p = 2.29\%$.

The description will be further made as to the embodiments of the present invention in conjunction with the accompanying drawings of FIGS. 1-5. In accordance with the purposes of this invention, as embodied and broadly described herein, this invention, in one aspect, relates to a BHJ solar cell that utilizes an interfacial layer of TPDSi$_2$:TFB for enhancing the fill factor and the open-circuit voltage, thereby, improving the cell power conversion efficiency.

Figure 1:
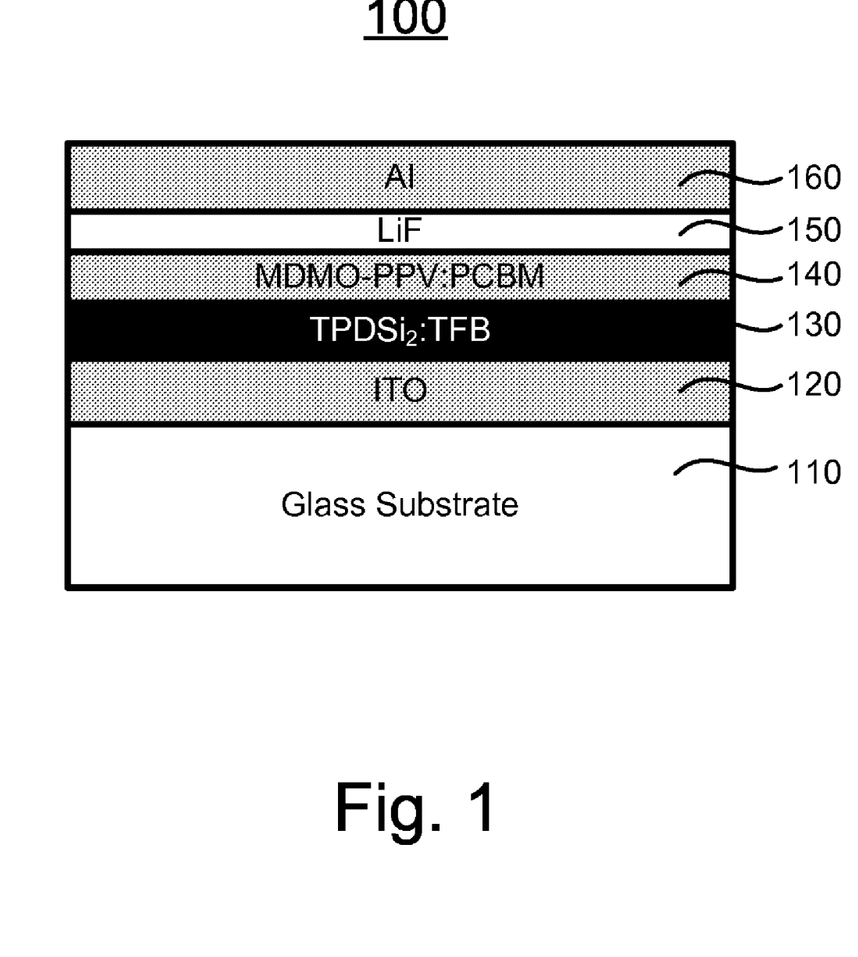
FIG. 1 shows schematically a BHJ solar cell device with a TPDSi$_2$:TFB interfacial layer according to one embodiment of the present invention.

Referring to FIG. 1, a BHJ solar cell 100 is shown according to one embodiment of the present invention. The BHJ solar cell 100 includes a transparent glass substrate 110, an anode 120 formed on the transparent glass substrate 110, an interfacial layer 130 formed on the anode 120, an active organic layer 140 formed on the interfacial layer 130, a LiF layer 150 formed on the active organic layer 140, and a metallic cathode 160 formed on the LiF layer 150.

In one embodiment as shown in FIG. 1, the anode 120 is formed of a transparent, ITO, and has a thickness of about 150 nm. The LiF layer 150 is very thin, compared to the other layers of the solar cell 100, about 0.6 nm. The metallic cathode 160 can be an Al, Ti, W, Ag, or Au cathode, or the like. The cathode layer 160 is formed to have a thickness of about 80 nm in this embodiment.

The active organic layer 140 is formed from an electron-donating organic material and an electron-accepting organic material. The electron-donating organic material is a polymer including P3HT, MDMO-PPV, PFDTBT, PCPDTBT, PPE-PPV, or the like. The electron-accepting organic material is a fullerene including PCBM, or the like. The ratio of the electron-donating organic material to the electron-accepting organic material in the active organic layer 140 is in a range of about 10:1 to 1:10 in weight. In the embodiment shown in FIG. 1, the active organic layer 140 is formed of MDMO-PPV and PCBM with a ratio of MDMO-PPV to PCBM about 1:4 by weight. The MDMO-PPV:PCBM active organic layer 140 is about 100 nm thick in the embodiment.

The interfacial layer 130 is adapted for blocking electron leakage from the active organic layer to the anode while transporting holes from the active organic layer 140 to the anode 120, and includes a hole-transporting polymer characterized with a hole-mobility higher than that of the electron-donating organic material in the active organic layer, and a small molecule characterized with a hole-mobility higher than that of the electron-donating organic material in the active organic layer and capable of crosslinking on contact with air. The HOMO levels of the hole-transporting polymer and the small molecule are aligned with the HOMO level of the electron-donating organic material in the active organic layer 140 so that holes generated in the active organic layer 140 are able to travel through the interfacial layer 130 to collection at the anode 120 without an energetic barrier. Additionally, the LUMO levels of the hole-transporting polymer and the small molecule lie far above the LUMO level of the electron-accepting organic material in the active organic layer 140 so that an energetic barrier is present to prevent electrons generated in the active organic layer 140 from transferring through the interfacial layer 130 into the anode 120.

Figure 2:
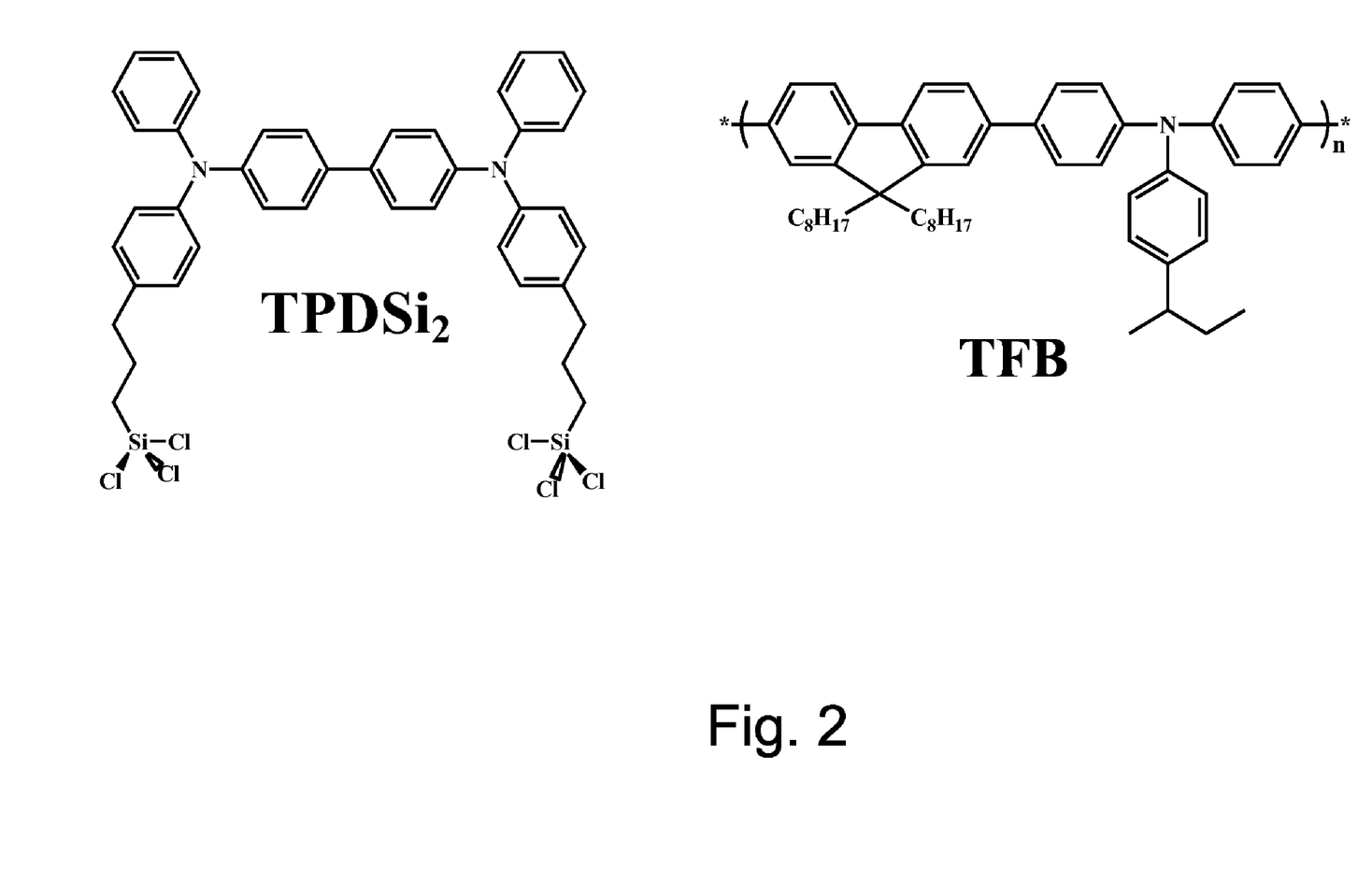
FIG. 2 shows chemical structures of interfacial blend components (a) TPDSi$_2$ and (b) TFB of the TPDSi$_2$:TFB interfacial layer shown in FIG. 1.
Figure 3:
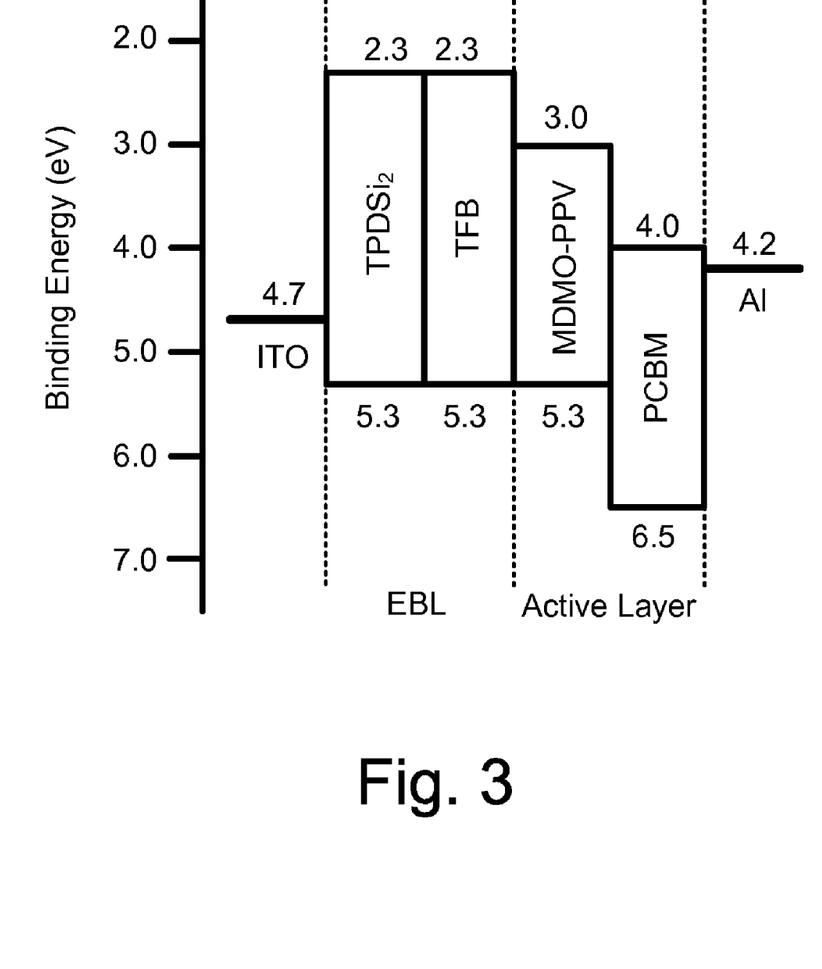
FIG. 3 shows an energy level diagram for a MDMO-PPV:PCBM BHJ solar cell with a TFB:TPDSi$_2$ interfacial layer shown in FIG. 1.

In one embodiment shown in FIG. 1, the hole-transporting polymer includes TFB, and the small molecule includes $TPDSi_2$. The chemical structures of the TFB and $TPDSi_2$ are shown in FIG. 2. An energy level diagram of such a MDMO-PPV:PCBM BHJ solar cell with an interfacial $TPDSi_2$:TFB layer is shown in FIG. 3. The LUMO levels of the $TPDSi_2$ and TFB are about 2.3 eV, while their HOMO levels are about 5.3 eV. The LUMO levels of the MDMO-PPV and PCBM are about 3.0 eV and 4.0 eV, respectively, while their HOMO levels are about 5.3 eV and 6.5 eV, respectively.

In one embodiment, the ratio of $TPDSi_2$ to TFB in the interfacial layer is about 1:1 in weight. The interfacial layer 130 in one embodiment has a thickness of about 1-80 nm, preferably, about 2-30 nm. Moreover, it is transparent to light of wavelengths greater than 430 nm so that it has no interference with light reaching the active organic layer 140.

Another aspect of the present invention provides an organic photovoltaic device having one or a plurality of solar cells as described above. The plurality of solar cells are configured to be in a stack arrangement.

These and other aspects of the present invention are more specifically described below.

IMPLEMENTATIONS AND EXAMPLES OF THE INVENTION

Without intent to limit the scope of the invention, exemplary methods and their related results according to the embodiments of the present invention are given below. Note that titles or subtitles may be used in the examples for convenience of a reader, which in no way should limit the scope of the invention. Moreover, certain theories are proposed and disclosed herein; however, in no way they, whether they are right or wrong, should limit the scope of the invention so long as the invention is practiced according to the invention without regard for any particular theory or scheme of action.

In this exemplary example, a bulk-heterojunction ITO/$TPDSi_2$:TFB/MDMO-PPV:PCBM/LiF/Al solar cell is fabricated and characterized according to one embodiment of the present invention. The interfacial layer of $TPDSi_2$:TFB possesses a number of advantages over PEDOT:PSS, and yields OPV performance superior to that of devices without an interfacial layer, or with a PEDOT:PSS interfacial layer. For example, the replacement of the interfacial $TPDSi_2$:TFB layer affords cell power conversion efficiencies as high as 2.23%, and enhances the fill factor (FF) to 54.4% and the open-circuit voltage ($V_{oc}$) to 890 mV versus an ITO/PEDOT:PSS/MDMO-PPV:PCBM/LiF/Al control device.

Figure 4:
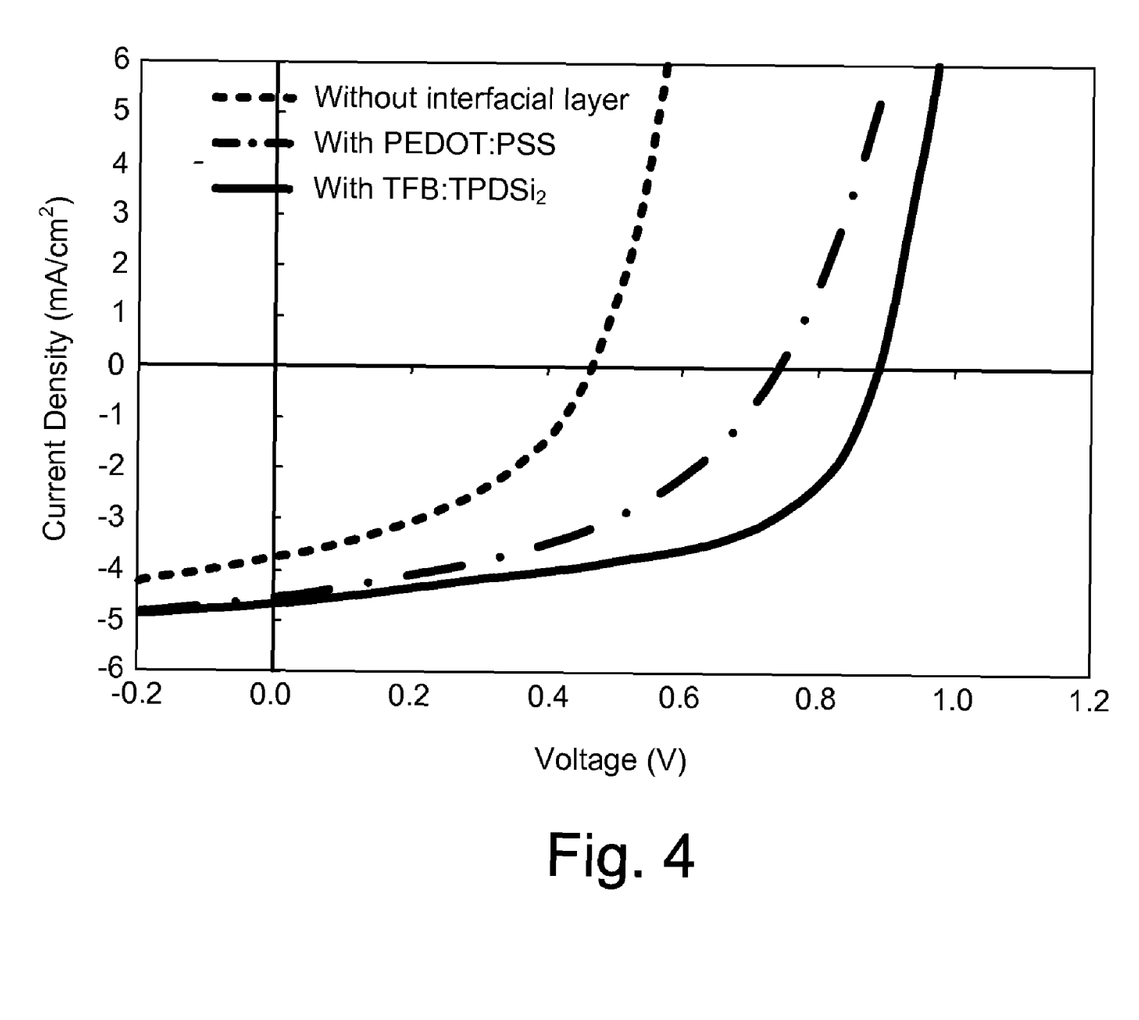
FIG. 4 shows J-V curves of a MDMO-PPV:PCBM BHJ solar cell with a 15 nm TFB:TPDSi$_2$ interfacial layer, with a PEDOT:PSS interfacial layer, or with no interfacial layer. With the TFB:TPDSi$_2$ interfacial layer: $V_{oc}$=0.89 V, $J_{SC}$=4.62 mA/cm$^2$, FF=54.4%, and $\eta_p$=2.23%. With the PEDOT:PSS interfacial layer: $V_{oc}$=0.74 V, $J_{SC}$=4.56 mA/cm$^2$, FF=43.4%, and $\eta_p$=1.46%. With no interfacial layer: $V_{oc}$=0.47 V, $J_{SC}$=3.75 mA/cm$^2$, FF=41.3%, and $\eta_p$=0.73%.

The interfacial layer includes two materials: a hole-transporting polymer, TFB, and a small molecule, $TPDSi_2$. In fabrication, a 1:1 mixture by weight of the two materials is spin-coated from a toluene solution directly on a clean ITO anode to yield a thin layer (<15 nm) on the ITO anode. BHJ solar cells using MDMO-PPV:PCBM as an active layer are then fabricated with and without the presence of this interfacial layer. LiF/Al (about 0.6 nm/80 nm) cathodes are then deposited. The BHJ solar cells are encapsulated inside a nitrogen-filled glove box. The BHJ solar cell devices are evaluated under 1000 $mW/cm^2$ AM1.5G simulated sunlight with a Class A solar cell analyzer (Spectra Nova Technologies, Ottawa, Ontario, Canada). The analyzer is calibrated with a silicon solar cell fitted with a KG5 filter. The filtered reference cell is tested and certified by NREL to ensure that the spectral mismatch correction factor is unity. Typical J-V results are shown in FIG. 4. The BHJ solar cell devices fabricated on a bare ITO without an interfacial layer consistently exhibit low $V_{oc}$ and low $\eta_p$ responses. In the J-V plot shown in FIG. 4, $V_{oc}$=0.47 V, $J_{sc}$=3.75 $mA/cm^2$, FF=41.3%, and $\eta_p$=0.73%. The BHJ solar cell devices made with an interfacial PEDOT:PSS layer improve device performance, yielding $V_{oc}$=0.74 V, $J_{sc}$=4.56 $mA/cm^2$, FF=43.4%, and $\eta_p$=1.46%. The BHJ solar cell devices having a TFB:$TPDSi_2$ interfacial layer increases all solar cell response metrics. For the TFB:$TPDSi_2$-modified device, $V_{oc}$=0.89 V, $J_{sc}$=4.62 $mA/cm^2$, FF=54.4%, and $\eta_p$=2.23%, as shown in FIG. 4. This is higher than any devices made with the common PEDOT:PSS interfacial layer or with no interfacial layer, and the efficiency is among the highest reported in the literature for MDMO-PPV:PCBM solar cells.

The $TPDSi_2$:TFB blend is chosen to fulfill several requirements to be a successful anode-side interfacial layer in an organic solar cell. First, it is transparent to light of wavelengths above 430 nm, so it will not interfere with light reaching the active layer. Second, the $TPDSi_2$:TFB layer constitutes a hole-transporting layer with a hole mobility greater than that of the polymer (MDMO-PPV) used in the active layer so that no build-up of charges occurs in the interfacial layer. Third, as shown in FIG. 3, the HOMO levels of $TPDSi_2$ and TFB are aligned with the HOMO of the active layer polymer (MDMO-PPV) so that holes generated in the active layer are able to travel through the interfacial layer to collection at the ITO without an energetic barrier.

Additionally, the LUMO levels of TFB and TPDSi$_2$ lie far above the LUMO of PCBM, so an energetic barrier is present to prevent any electrons generated in the PCBM from transferring through the interfacial layer into the ITO anode. It therefore provides certain resistance to charge flow in the wrong direction, or leakage current. This will mitigate the loss of $V_{oc}$ that occurs when no interfacial layer is present to suppress this leakage of charge carriers.

Figure 5:
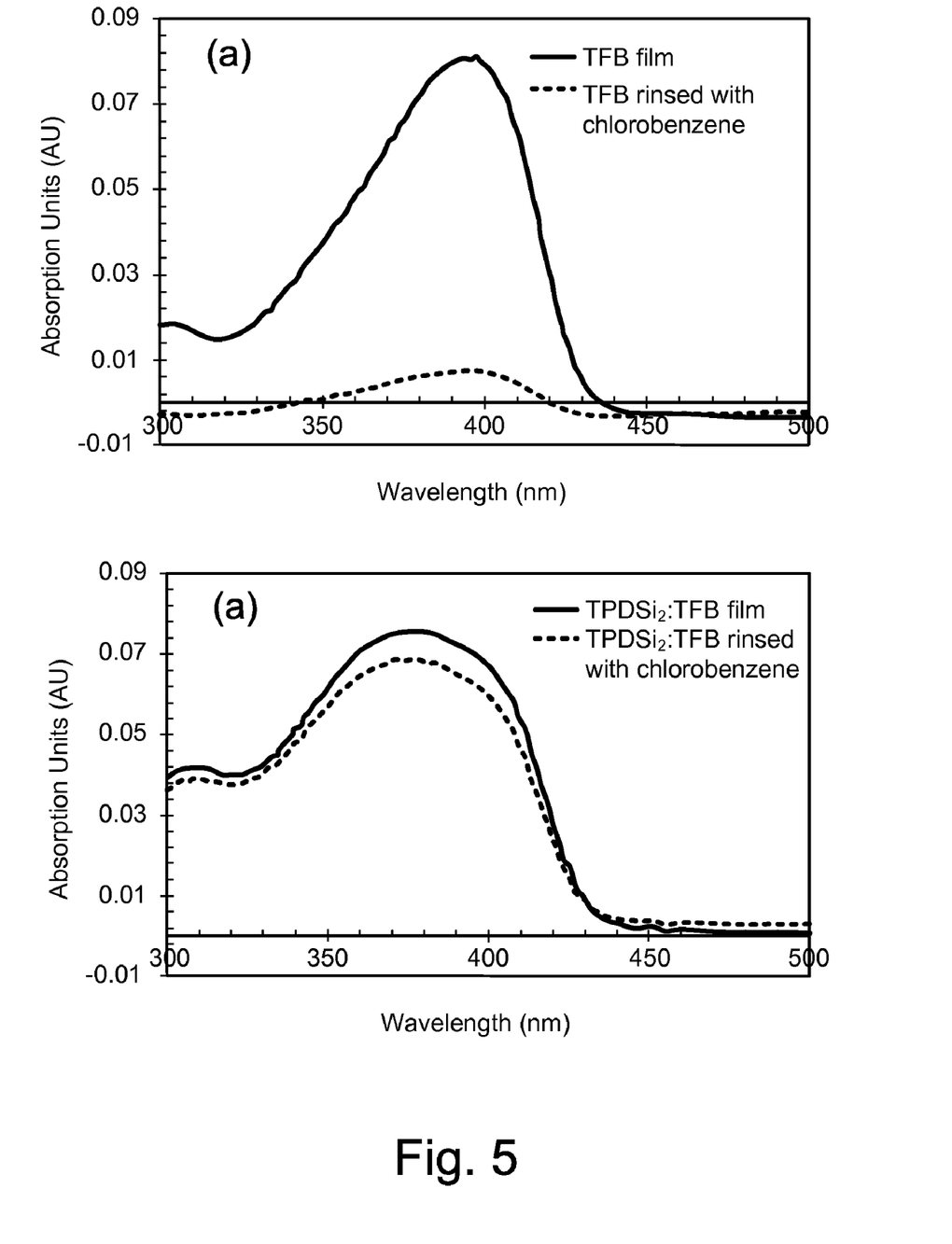
FIG. 5 shows UV-Vis spectra showing (a) TFB being dissolved by chlorobenzene and (b) TFB:TPDSi$_2$ remaining insoluble in chlorobenzene after crosslinking.

A final issue of importance with the interfacial layer is that of adhesion to the ITO surface and compatibility with the active layer. TPDSi$_2$ undergoes crosslinking when exposed to air, and the two trichlorosilane-terminal tethers covalently bind the molecule to the hydroxyl-terminated ITO surface. This crosslinking occurs readily in air, and ensures intimate contact with the electrode and that a robust, insoluble film of TFB:TPDSi$_2$ is formed. The crosslinked TPDSi$_2$ holds the TFB in place, and the blended film is insoluble, even when soaked in chlorobenzene for several minutes, as shown in FIG. 5. This allows the active layer to be spin-coated on top of the interfacial layer without dissolution. Being an organic blend spin-coated from toluene, it interacts well with the active layer that is spin-coated from chlorobenzene, and the poor ITO/active layer interface is avoided.

The good contact with the active layer and the covalent bonds that fasten the TPDSi$_2$:TFB blend to the ITO anode allow the finished device to withstand greater thermal stress than typical MDMO-PPV:PCBM BHJ cells. When completely encapsulated devices are heated on a hotplate to 60° C. for about 1 hour, the devices with no interfacial layer or with a PEDOT:PSS interfacial layer fail. However, when the devices with a TPDSi$_2$:TFB interlayer are exposed to heat under the same conditions, there is no significant change in $V_{oc}$, $J_{sc}$, FF or $\eta_p$.

The present invention, among other things, discloses a BHJ solar cell that utilizes a thin, covalently-bound interfacial layer of TPDSi$_2$:TFB to maximize hole transport from the active layer to the anode and minimize charge recombination losses at the anode. The interfacial layer of TPDSi$_2$:TFB has been designed and implemented into BHJ solar cells. This hole-conducting blend does not interfere with light absorption, matches the energy levels of the donor polymer used, covalently bonds to the ITO surface and crosslinks in air to remain insoluble through active layer deposition. BHJ solar cell devices with the interfacial layer exhibit enhanced durability and resilience to heating, remaining unaffected when heated to 60° C. while control devices exposed to this temperature fail. Overall solar cell performance is far better for devices with the TPDSi$_2$:TFB interfacial layer than that for devices with no interfacial layer or with a PEDOT:PSS interfacial layer, and power conversion efficiencies of 2.23% rival or exceed those of the most efficient devices reported for this polymer system in the literature using PEDOT:PSS as an interfacial layer.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to enable others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

LIST OF REFERENCES

[1]. H. Hoppe and N. S. Sariciftci, J. Mater. Res. 19, 1924 (2004).

[2]. K. M. Coakley and M. D. McGehee, Chem. Mater. 16, 4533 (2004).

[3]. W. Ma, C. Yang, X. Gona, K. Lee and A. J. Heeger, Adv. Funct. Mater. 15, 1617 (2005).

[4]. G. Li, V. Shrotriya, J. Huang, Y. Yao, T. Moriarty, K. Emery and Y. Yang, Nat. Mater. 4, 864 (2005).

[5]. K. Kim, J. Liu, M. A. G. Namboothiry and D. L. Carroll, Appl. Phys. Lett. 90, 163511 (2007).

[6]. P. Peumans, A. Yakimov and S. R. Forrest, J. Appl. Phys. 93, 3693 (2003).

[7]. M. C. Scharber, D. Muihlbacher, M. Koppe, P. Denk, C. Waldauf, A. J. Heeger and C. J. Brabec, Adv. Mater. 18, 789 (2006).

[8]. S. Chaudhary, H. Lu, A. M. Müller, C. J. Bardeen and M. Ozkan, Nano Lett. 7, 1973 (2007).

[9]. J. Baffreau, S. Leroy-Lhez, H. Derbal, A. R. Inigo, J.-M. Nunzi, M. M. Groeneveld, R. M. Williams and P. Hudhomme, Eur. Phys. J. Appl. Phys. 36, 301 (2007).

[10]. C. W. Tang, Appl. Phys. Lett. 48, 183 (1986).

[11]. G. Yu, J. Gao, J. C. Hummelen, F. Wudl and A. J. Heeger, Science 270, 1789 (1995).

[12]. A. Cravino and N. S. Sariciftci, Nat. Mater. 2, 360 (2003).

[13]. A. Moliton and J.-M. Nunzi, Polym. Int. 55, 583 (2006).

[14]. H. Hoppe, T. Glatzel, M. Niggemann, W. Schwinger, F. Schaeffler, A. Hinsch, M. C. Lux-Steiner and N. S. Sariciftci, Thin Solid Films 511-512, 587 (2006).

[15]. M. Y. Chan, C. S. Lee, S. L. Lai, M. K. Fung, F. L. Wong, H. Y. Sun, K. M. Lau and S. T. Lee, J. Appl. Phys. 100, 094506 (2006).

[16]. A. W. Hains, A. B. F. Martinson, M. D. Irwin, H. Yan and T. J. Marks, Polym. Mater. Sci. Eng. 96, 814 (2007).

[17]. S. E. Shaheen, C. J. Brabec and N. S. Sariciftci, Appl. Phys. Lett. 78, 841 (2001).

[18]. C. J. Brabec, S. E. Shaheen, C. Winder and N. S. Sariciftci, Appl. Phys. Lett. 80, 1288 (2002).

[19]. S. K. M. Jönsson, E. Carlegrim, F. Zhang, W. R. Salaneck and M. Fahlman, Jpn. J. Appl. Phys., Part 2 44, 3695 (2001).

[20]. F. Zhang, M. Ceder and O. Inganäs, Adv. Mater. 19, 1835 (2007).

[21]. P. Peumans and S. R. Forrest, Appl. Phys. Lett. 79, 126 (2001).

[22]. K. Takahashi, S. Suzaka, Y. Sigeyama, T. Yamaguchi, J.-i. Nakamura and K. Murata, Chem. Lett. 36, 762 (2007).

[23]. H. Yan, P. Lee, N. R. Armstrong, A. Graham, G. A. Evmenenko, P. Dutta and T. J. Marks, J. Am. Chem. Soc. 127, 3172 (2005).

[24]. M. P. d. Jong, L. J. v. IJzendoorn and M. J. A. d. Voigt, Appl. Phys. Lett. 77, 2255 (2000).

[25]. K. W. Wong, H. L. Yip, Y. Luo, K. Y. Wong, W. M. Lau, K. H. Low, H. F. Chow, Z. Q. Gao, L. Yeung and C. C. Chang, Appl. Phys. Lett. 80, 2788 (2002).

[26]. M. M. Koetse, J. Sweelssen, T. Franse, S. C. Veenstra, J. M. Kroon, X. Yang, A. Alexeev, J. Loos, U.S. Schubert and H. F. M. Schoo, Proc. SPIE-Int. Soc. Opt. Eng. 6, 5215 (2003).

What is claimed is:

1. A solar cell, comprising:
   a. an anode;
   b. an active organic layer comprising an electron-donating organic material and an electron-accepting organic material; and
   c. an interfacial layer formed between the anode and active organic layer, wherein the interfacial layer comprises a hole-transporting polymer characterized with a hole-mobility higher than that of the electron-donating organic material in the active organic layer, and a small molecule characterized with a hole-mobility higher than that of the electron-donating organic material in the active organic layer and capable of crosslinking on contact with air, wherein the interfacial layer is adapted such that the highest occupied molecular orbital (HOMO) levels of the hole-transporting polymer and the small molecule are aligned with the HOMO level of the electron-donating organic material in the active organic layer so that holes generated in the active organic layer are able to travel through the interfacial layer to collection at the anode without an energetic barrier, wherein the hole-transporting polymer comprises poly(9,9-dioctylfluorene-co-N-(4-(3-methylpropyl))diphenylamine) (TFB), and wherein the small molecule comprises 4,4'-bis[(p-trichlorosilylpropylphenyl)phenylamino]biphenyl (TPDSi$_2$).

2. The solar cell of claim 1, wherein the interfacial layer is adapted such that the lowest unoccupied molecular orbital (LUMO) levels of the hole-transporting polymer and the small molecule lie far above the LUMO level of the electron-accepting organic material in the active organic layer so that an energetic barrier is present to prevent electrons generated in the active organic layer from transferring through the interfacial layer into the anode.

3. The solar cell of claim 1, wherein the interfacial layer is adapted for blocking electron leakage from the active organic layer to the anode while transporting holes from the active organic layer to the anode.

4. The solar cell of claim 1, wherein the interfacial layer is transparent to light of wavelengths greater than 430 nm so that it has no interference with light reaching the active organic layer.

5. The solar cell of claim 1, wherein the ratio of TPDSi$_2$ to TFB in the interfacial layer is about 1:1 in weight.

6. The solar cell of claim 1, wherein the interfacial layer has a thickness of about 1-80 nm, preferably, about 2-20 nm.

7. The solar cell of claim 1, further comprising:
   a. a lithium fluoride (LiF) layer formed on the active organic layer; and
   b. a cathode formed on the LiF layer.

8. The solar cell of claim 7, wherein the cathode is formed of a metal, wherein the metal comprises aluminum (Al), titanium (Ti), tungsten (W), silver (Ag), gold (Au), or an alloy thereof.

9. The solar cell of claim 1, wherein the anode is transparent and formed of tin-doped indium oxide (ITO).

10. The solar cell of claim 1, wherein the electron-donating organic material comprises poly(3-hexylthiophene) (P3HT), poly(2-methoxy-5-(3',7'-dimethyl-octyloxy))-p-phenylene vinylene (MDMO-PPV), poly(2,7-(9-(2'-ethylhexyl)-9-hexyl-fluorene)-alt-5,5-(4',7'-di-2-thienyl-2',1',3'-benzothiadiazole)) (PFDTBT), poly(2,6-(4,4-bis-(2-ethylhexyl)-4H-cyclopenta(2,1-b;3,4-6')dithiophene)-alt-4,7-(2,1,3-benzothiadiazole)) (PCPDTBT), or poly(p-phenylene-ethynylene)-alt-poly(p-phenylene-vinylene) (PPE-PPV), and wherein the electron-accepting organic material comprises [6,6]-phenyl-C$_{61}$ butyric acid methyl ester (PCBM).

11. The solar cell of claim 10, wherein the ratio of the electron-donating organic material to the electron-accepting organic material in the active organic layer is about 1:4 in weight.

12. An organic photovoltaic device comprising a plurality of solar cells of claim 1, wherein the plurality of solar cells are configured to be in a stack.

13. An organic photovoltaic device comprising one or more solar cells of claim 1.

14. An organic photovoltaic device, comprising:
   one or more solar cells, each solar cell comprising:
   a. a transparent substrate;
   b. a tin-doped indium oxide (ITO) or other transparent conducting anode formed on the transparent substrate;
   c. an interfacial layer formed on the ITO anode, the interfacial layer comprising poly(9,9-dioctylfluorene-co-N-(4-(3-methylpropyl))diphenylamine) (TFB) and 4,4'-bis[(p-trichlorosilylpropylphenyl)phenylamino]biphenyl (TPDSi$_2$);
   d. an active organic layer formed on the interfacial layer, the active organic layer comprising poly(2-methoxy-5-(3',7'-dimethyl-octyloxy))-p-phenylene vinylene (MDMO-PPV) and [6,6]-phenyl-C$_{61}$ butyric acid methyl ester (PCBM);
   e. a lithium fluoride (LiF) layer formed on the active organic layer; and
   f. an aluminum (Al) cathode formed on the LiF layer.

15. The organic photovoltaic device of claim 14, wherein the interfacial layer has a thickness of about 1-80 nm, preferably, about 2-30 nm.

16. The organic photovoltaic device of claim 14, wherein the ratio of TPDSi$_2$ to TFB in the interfacial layer is about 1:1 in weight.

17. The organic photovoltaic device of claim 14, wherein the ratio of MDMO-PPV to PCBM in the active organic layer is about 1:4 in weight.

* * * * *

UNITED STATES PATENT AND TRADEMARK OFFICE
CERTIFICATE OF CORRECTION

PATENT NO. : 7,888,593 B2　　　　　　　　　　　　　　　　　　　　　　Page 1 of 1
APPLICATION NO. : 12/046983
DATED : February 15, 2011
INVENTOR(S) : Tobin J. Marks et al.

It is certified that error appears in the above-identified patent and that said Letters Patent is hereby corrected as shown below:

Title page, item [75]

Add the name of the first named inventor --Tobin J. Marks--.

In Column 1, Lines 33-36 please delete:

"The invention was made with Government support under Contract No. DE-FG02-06ER46320 awarded by the Department of Energy of the United States. The Government has certain rights in the invention."

In Column 1, Lines 33-36 please add:

--This invention was made with government support under Grant No. DOE: DE-FG02-06ER46320 awarded by the Department of Energy. The government has certain rights in the invention.--

Signed and Sealed this
Twenty-eighth Day of June, 2011

David J. Kappos
*Director of the United States Patent and Trademark Office*